United States Patent
Ivanov et al.

(10) Patent No.: US 7,063,773 B2
(45) Date of Patent: Jun. 20, 2006

(54) HIGH PURITY SPUTTER TARGETS WITH TARGET END-OF-LIFE INDICATION AND METHOD OF MANUFACTURE

(75) Inventors: Eugene Y. Ivanov, Grove City, OH (US); David B. Smathers, Columbus, OH (US); Charles E. Wickersham, Jr., Columbus, OH (US); John E. Poole, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 273 days.

(21) Appl. No.: 10/344,783

(22) PCT Filed: Aug. 17, 2001

(86) PCT No.: PCT/US01/41775

§ 371 (c)(1),
(2), (4) Date: Jul. 23, 2003

(87) PCT Pub. No.: WO02/14571

PCT Pub. Date: Feb. 21, 2002

(65) Prior Publication Data

US 2004/0020769 A1 Feb. 5, 2004

Related U.S. Application Data

(60) Provisional application No. 60/241,060, filed on Oct. 17, 2000, provisional application No. 60/226,073, filed on Aug. 17, 2000.

(51) Int. Cl.
*C23C 14/34* (2006.01)

(52) U.S. Cl. .......................... 204/192.12; 204/192.13; 204/298.12; 204/298.13; 204/298.03

(58) Field of Classification Search ............ 204/298.12, 204/298.13, 192.13, 298.03, 192.12; 156/272.2, 156/308.2; 228/193, 194, 195
See application file for complete search history.

(56) References Cited

U.S. PATENT DOCUMENTS 4,341,816 A * 7/1982 Lauterbach et al. ........ 427/456

(Continued)

FOREIGN PATENT DOCUMENTS

JP          11-029858       *  2/1999

OTHER PUBLICATIONS

Machine Translation of 11-029858.*

*Primary Examiner*—Rodney G. McDonald
(74) *Attorney, Agent, or Firm*—Wegman, Hessler & Vanderburg (57) ABSTRACT

A preferred sputter target assembly (10, 10') comprises a target (12, 12'), a backing plate (14, 14') bonded to the target (12, 12') along an interface (22, 22') and dielectric particles (20, 20') between the target (12, 12') and the backing plate (14, 14'). A preferred method for manufacturing the sputter target assembly (10, 10') comprises the steps of providing the target (12, 12') and the backing plate (14, 14'); distributing the dielectric particles (20, 20') between mating surfaces (24, 26) of the target (12, 12') and the backing plate (14, 14'), most preferably along a sputtering track pattern on one of the mating surfaces; and bonding the target (12, 12') to the backing plate (14, 14') along the mating surfaces (24, 26). A preferred method for sputtering in accordance with the invention comprises the steps of applying electrical power to the sputter target (50, 160); causing the sputter target assembly (50, 160) to produce an electromagnetic signal (not shown) when a target end-of-life condition exists; and monitoring the sputter target assembly (50, 160) to detect the electromagnetic signal.

14 Claims, 7 Drawing Sheets

U.S. PATENT DOCUMENTS

| | | |
|---|---|---|
| 4,407,708 A | 10/1983 | Landau |
| 4,545,882 A | 10/1985 | McKelvey |
| 4,983,269 A * | 1/1991 | Wegmann .............. 204/192.13 |
| 5,230,459 A | 7/1993 | Mueller et al. |
| 5,282,943 A * | 2/1994 | Lannutti et al. ....... 204/192.12 |
| 5,487,823 A | 1/1996 | Sawada et al. |
| 6,071,389 A | 6/2000 | Zhang |
| 6,085,966 A | 7/2000 | Shimomuki et al. |
| 6,340,415 B1 * | 1/2002 | Raaijmakers et al. .. 204/192.12 |
| 6,521,108 B1 * | 2/2003 | Zhang ................... 204/298.13 |

* cited by examiner

HIGH PURITY SPUTTER TARGETS WITH TARGET END-OF-LIFE INDICATION AND METHOD OF MANUFACTURE

CROSS-REFERENCE TO RELATED APPLICATIONS

Priority filing benefit of (1) International PCT application PCT/US01/41775 filed Aug. 17, 2001, and published under PCT 21(2) in the English language; (2) U.S. Provisional Application Ser. No. 60/226,073 filed Aug. 17, 2000; 60/241,060 filed Oct. 17, 2000.

FIELD OF THE INVENTION

This invention relates to cathodic sputtering methods and apparatus, and, more specifically, to methods and apparatus relating to sputter target assemblies providing electromagnetic signals representative of target end-of-life conditions.

BACKGROUND OF THE INVENTION

Cathodic sputtering is widely used for the deposition of thin layers of material onto substrates. Basically, a sputtering process requires gas ion bombardment of a target formed from a material that is to be deposited as a thin film or layer on a given substrate. During such a process, the target is positioned such that a sputtering surface of the target faces the substrate across a chamber which has been evacuated and refilled with an inert gas, preferably argon. A high voltage electrical field is applied between the target, which acts as a cathode, and an anode located near the sputter target. The electric field induces electrons drawn from the cathode to collide with the molecules of the inert gas, thereby ionizing the gas. Positively charged gas ions are attracted to the cathode, where the ions dislodge minute quantities of material from the sputtering surface. The dislodged target material traverses the evacuated enclosure and deposits to form the thin film on the substrate.

Sputter target assemblies often are formed through bonding rear surfaces of the targets to backing plates. In addition to providing support for the targets, the backing plates also serve to conduct electrical power to the targets and to dissipate heat generated during sputtering processes. The latter function often is carried out by affixing heat exchange tubing to the backing plate. It generally is desirable that the electrical and thermal properties of the backing plate material be matched to those of the target material so as to minimize impedance as well as the risk of differential expansion between the two materials.

As the sputtering process proceeds, the sputtering surface itself erodes. Generally, this erosion is not uniform across the surface of the target. Often, an applied magnetic field is used to improve the efficiency of the sputtering process. Such magnetic fields tend to induce the formation of erosion grooves along "sputter tracks" on the sputtering surfaces. It frequently is possible to predict the pattern of the sputtering tracks which will form on a particular type of target in a particular type of sputtering system.

As the sputtering process continues, the sputtering tracks deepen, eventually burning through a rear surface of the target to the interface between the target and the backing plate. The burn-through of the interface will be referred to hereinafter as a "target end-of-life condition." Continued sputtering after the target end-of-life condition is reached leads to the possibility of contamination of the substrate due to sputtering of the backing plate material or, when no backing plate is present, to the possibility of rupture and severe damage to the sputtering chamber due to re-pressurization of the chamber or leakage of heat exchange fluid.

Two competing considerations determine the useful life of a sputter target. On the one hand, since sputtering is often performed using high purity metals or other expensive materials, it is desirable to obtain as much use from a target as possible. On the other hand, it is undesirable to continue use of a target after a target end-of-life condition is reached. Although it is known to monitor target life by maintaining a count of the number of sputtering cycles in which a particular target has been used, it is possible for the counter to be reset or for the user to be overly aggressive in target consumption. Hence, there remains a need in the art for methods for detecting target end-of-life conditions.

It is known to provide visual means for detecting target end-of-life conditions. One known technique involves painting colored dots or other patterns on the backing plate along the sputtering track so as to enhance the operator's ability to visually identify a target end-of-life condition. Another known technique uses a backing plate material visually distinguishable from the target material, so that the operator will readily identify deposits of sputtered backing plate material on the substrate. Each of these techniques has the drawback that the detection of a target end-of-life condition is dependent on the diligence of the operator throughout the sputtering process. The use of a backing plate material visually distinguishable from the target material has the additional drawback that visually distinguishable materials also likely will have different electrical and thermal properties, thereby increasing the impedance as well as the risk of differential expansion between the two materials.

As presently advised, it is also known to form sputter target assemblies in which pockets of pressurized gas are formed at the interface between the target and backing plate along the sputter tracks. When a target end-of-life condition occurs, these pockets of pressurized gas are ruptured, thereby increasing the pressure within the sputtering chamber. One drawback to this technique is the difficulty of forming such pockets of pressurized gas during the fabrication of the sputter target assembly. Another drawback is that the thermal conductivity of the pressure gas will likely be less than that of the surrounding target and backing plate materials, thereby risking thermal damage to the sputter target assembly.

During a sputtering process, the material removed from the sputtering surface forms a plasma in the region between the target and the substrate. Where dielectric impurities such as oxides or other ceramics are present along the sputtering surface, small electrical arcs tend to appear on the surface of the target. In the past, the occurrence of such arcs have been considered undesirable, since they tend to cause localized heating of the sputter surface. This localized heating increases the risk of macroparticle ejection, that is, the ejection of unusually large particles or droplets of sputtering material deleterious to the uniformity of the thin film of sputtering material formed on the substrate.

Therefore, there remains a need in the art for methods and apparatus for detecting target end-of-life conditions without operator intervention. There is a further need for sputter target assemblies designed to facilitate automatic target end-of-life conditions.

SUMMARY OF THE INVENTION

These needs and others are addressed by a preferred sputter target assembly comprising a target, a backing plate bonded to the target along an interface and dielectric particles located proximate to that interface. A preferred method for manufacturing the sputter target assembly comprises the steps of providing the target and the backing plate; distributing the dielectric particles between mating surfaces of the target and the backing plate, most preferably along a sputtering track on one of the mating surfaces; and bonding the target to the backing plate along the mating surfaces. Exemplary target materials for use in the method include high purity metals such as aluminum, copper, gold, iridium, palladium, platinum, rhodium, ruthenium, silver, tantalum, titanium, nickel, cobalt, tungsten, chromium, niobium, molybdenum, zirconium, hafnium and alloys thereof Exemplary backing plate materials for use in the method include high strength metals such as aluminum, titanium, copper, molybdenum and their alloys and stainless steels. Exemplary dielectric particles include particles of aluminum oxide, boron nitride, silicon oxide, tantalum oxide, titanium oxide, silicon nitride, silicon carbide, magnesium oxide and zirconium oxide. Preferably, the dielectric particles have sizes sufficiently large that the particles induce arcing when exposed to a sputtering plasma A preferred method for sputtering in accordance with the invention comprises the steps of applying electrical power to a sputter target assembly to induce molecular bombardment of a target of the sputter target assembly; causing the sputter target assembly to produce an electromagnetic signal when a target end-of-life condition exists; and monitoring the sputter target assembly to detect the electromagnetic signal. Where the method is carried out using a preferred target in accordance with the invention, the electromagnetic signal is caused by the exposure of the dielectric particles distributed at or near the interface between the target and the backing plate to the surrounding plasma when a target end-of-life condition is reached.

More specifically, a sputtering process in accordance with the invention commences with the application of electrical power to the sputter target assembly, thereby inducing bombardment of a sputter surface of the target by ionized gas. As noted earlier, the bombardment of the sputter surface by ionized gas dislodges minute quantities of the sputter material. As this process continues, the target erodes, most significantly along the sputter tracks on the sputter surface. Eventually, the erosion burns through to the dielectric particles at or near the interface between the target and the backing plate. The exposure of the dielectric particles to the plasma near the sputter surface of the target creates conditions suitable for an increased degree of arcing. This arcing generates both optical signals in the form of emitted light and electrical signals in the form of abrupt changes in the current demand of the target when a target end-of-life condition is reached and as a result of the rapid current change, radio waves are generated.

Thus, in accordance with the preferred sputtering method, the sputter target assembly is monitored to detect an electromagnetic signal indicative of a target end-of-life condition, such as emitted light or changes in the current flowing to the sputter target assembly indicative of an increased degree of arcing at the sputter surface of the target. In accordance with an especially preferred method, electrical power is removed from the sputter target assembly to stop the sputtering process after the electromagnetic signal is detected.

Further advantages, objectives and features of the present invention will become apparent in the following detail description when considered together with the drawing figures and appended claims.

DETAILED DESCRIPTION OF THE PREFERRED EMBODIMENTS

Figure 1:
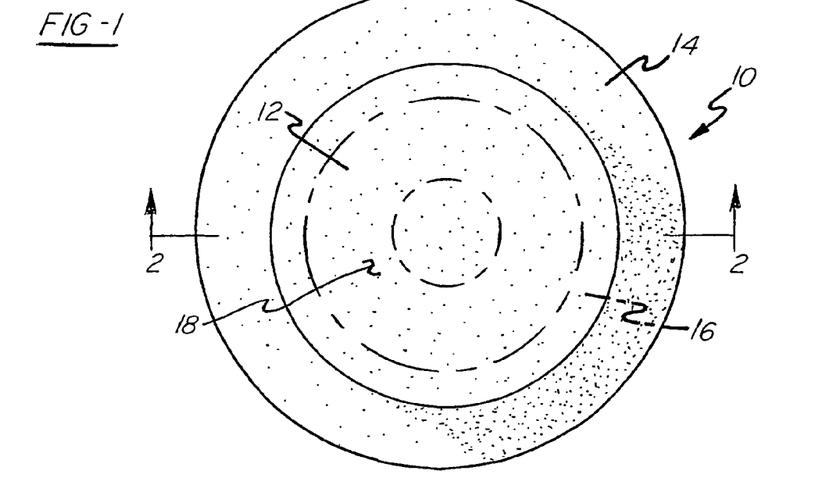
FIG. 1 is a top plan view of a first preferred embodiment of a sputter target assembly in accordance with the invention.
Figure 2:
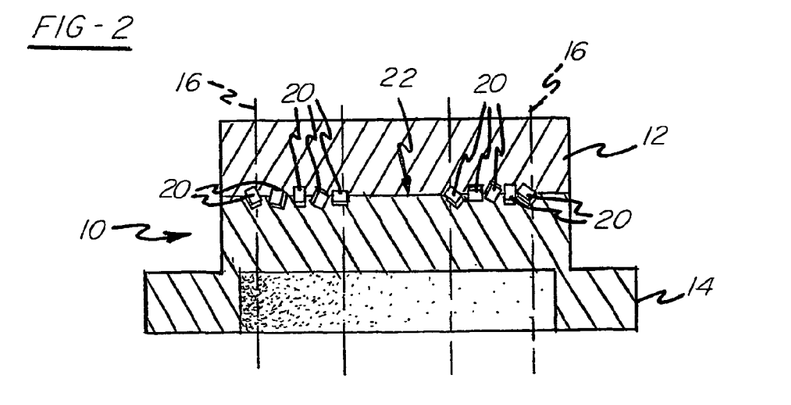
FIG. 2 is a schematic sectional view of the sputter target assembly of FIG. 1, taken along the line 2—2 in FIG. 1.

Referring initially to FIG. 1, a first preferred embodiment of a sputtering target assembly 10 includes a target 12 bonded to a backing plate 14. The target 12 defines one or more sputtering track patterns 16 (only one shown in FIG. 1) extending along a sputter surface 18 of the target 12. Referring to FIG. 2, the sputter target assembly 10 includes dielectric particles 20 in the form of discrete particles or grit distributed near an interface 22 between the target 12 and the backing plate 14. As shown, the dielectric particles 20 are distributed along the deepest sputter track 16.

The selection of suitable combinations of materials for constructing the target 12 and the backing plate 14 is within the ordinary skill in the art. Preferred materials for making the target 12 include high purity metals such as aluminum, copper, gold, iridium, palladium, platinum, rhodium, ruthenium, silver, tantalum, titanium and alloys thereof. Preferred materials for making the backing plate 14 include high strength metals such as aluminum, copper and their alloys. Exemplary dielectric particles 20 include particles of aluminum oxide, boron nitride, silicon oxide, tantalum oxide, titanium oxide, silicon nitride, silicon carbide, magnesium oxide and zirconium oxide. Also a felt of such materials such as al aluminum oxide felt can be mentioned as exemplary.

Most preferably, the dielectric particles have sizes sufficiently large that the particles induce arcing when exposed to a sputtering plasma at high voltage. For example, it has been found that isolated discrete aluminum oxide particles having maximum dimensions of about 100 μm–1,000 μm, more preferably about 300 μm–1,000 μm, are suitable for use in the present invention. It has been found experimentally that isolated discrete aluminum oxide particles having maximum dimensions significantly smaller than about 400 μm did not produce a significant degree of arcing when exposed during a sputtering process. On the other hand, it was found that the likelihood of release of macroparticles of aluminum increased monotonically as the size of the discrete aluminum oxide particles increased.

Ink-like coatings can be utilized having agglomerated dielectric particles therein. Typically, individual dielectric particles have sizes on the order of about 1 micron or less in these inks but are present in the ink carrier in agglomerates of greater than 1 mm in dimension.

Figure 3:
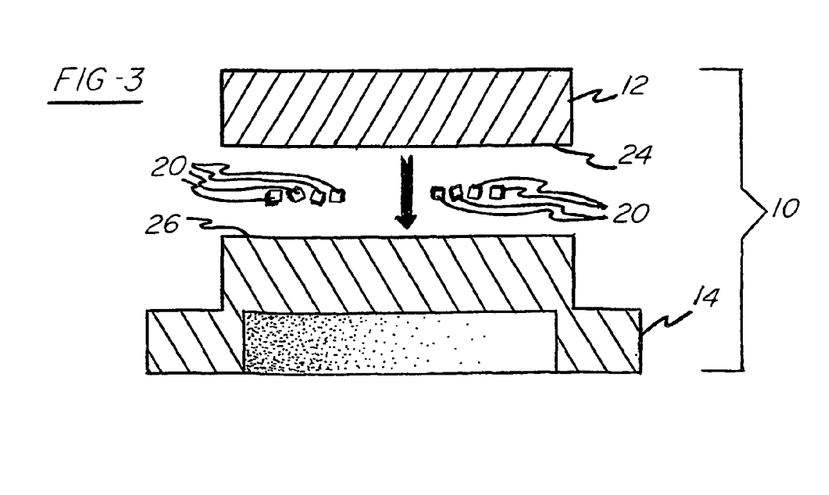
FIG. 3 is a schematic view illustrating a preferred method for manufacturing the sputter target assembly of FIG. 1.

As illustrated in FIG. 3, a preferred method for manufacturing the sputter target assembly 10 comprises the steps of providing the target 12 and the backing plate 14; distributing the dielectric particles 20 between mating surfaces 24 and 26 of the target 12 and the backing plate 14; and bonding the target 12 to the backing plate 14 along the mating surfaces 24, 26. In accordance with one especially preferred method, a plurality of teeth (not shown) are formed on one of the mating surfaces 24, 26, such as by the machining of concentric, V-shaped grooves as described in Mueller et al. U.S. Pat. No. 5,230,459, the disclosure of which is incorporated herein by reference. The dielectric particles 20 are positioned on one of the mating surfaces 24, 26 in a manner within the ordinary skill in the art, preferably concentrated around the sputter track 16 (FIGS. 1 and 2). The target 10 is placed onto a BP form (not shown) having a pocket (not shown) to accommodate the target 12. The target 12 and backing plate 14 are then subjected to one or more of vacuum pressing and vacuum electron beam welding to form a bond at the interface 22 (FIG. 2). Alternatively, the target 12 and the backing plate 14 are subjected to a combination of diffusion bonding and electron beam welding to form the bond at the interface 22 (FIG. 2). Once bonded, the sputter target assembly 10 is machined to final shape.

In accordance with another especially preferred method for manufacturing the sputter target assembly 10, one or both of the mating surfaces 24,26 is bead blasted with dielectric grit before the target 12 and the backing plate 14 are bonded together. The bead blasting serves both to position the dielectric grit and to provide surface roughening to promote the formation of a strong bond at the interface 20 (FIG. 2).

In accordance with yet another especially preferred method for manufacturing the sputter target assembly 10, the discrete dielectric particles 20 are combined with a paint (not shown) and applied to one of the mating surfaces 24, 26. Most preferably, the mating surface 24 or 26 is roughened before the paint is applied so as to facilitate the adhesion of the paint to that surface 24, 26.

In accordance with still another especially preferred method for manufacturing the sputter target assembly 10, the discrete dielectric particles 20 are combined with a bonding material (not shown) such as a solder paste or conductive adhesive (not shown), which is then used to form the bond between the target 12 and the backing plate 14 at the interface 20 (FIG. 2) by conventional techniques. Most preferably, one or both of the mating surfaces 24, 26 is roughened to promote bonding of the solder paste or conductive adhesive (not shown) to that surface 24, 26.

Figure 4:
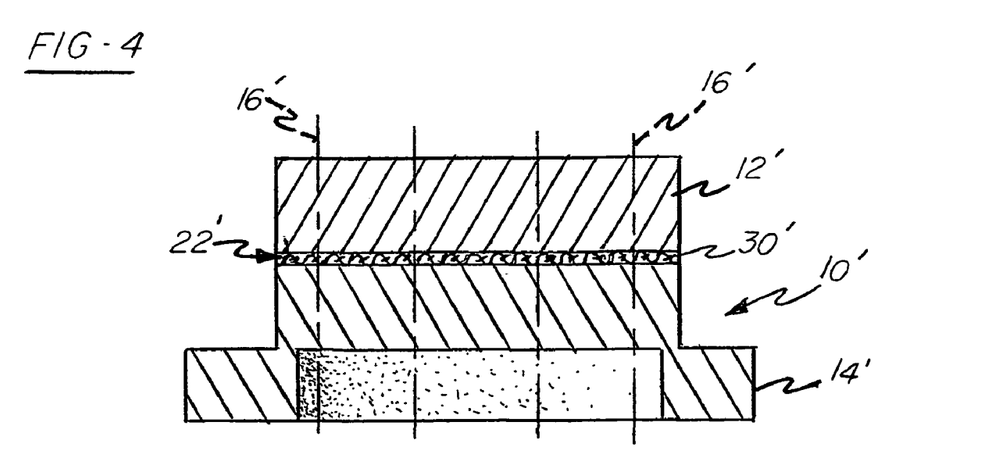
FIG. 4 is a schematic sectional view of a second preferred embodiment of a sputter target assembly.

Referring to FIG. 4, a second preferred embodiment of a sputtering target assembly 10' includes a target 12' bonded to a backing plate 14'. The target 12' defines one or more sputtering tracks 16' (only one shown in FIG. 4). The sputter target assembly 10' further includes, along an interface 22', a dielectric felt 30', that is, a plurality of dielectric fibers of suitable size pressed into a sheet-like material. In accordance with a preferred method for manufacturing the sputter target assembly 10', the dielectric felt 30' is positioned between the target 12 and the backing plate 14; and then the target 12 and the backing plate 14 are bonded in any suitable manner, such as by vacuum pressing, electron beam welding, soldering, adhesion or a combination thereof. Most preferably, the dielectric felt 30' aligns with the sputter tracks 16'.

Specific examples of preferred sputter target assemblies 10 (FIGS. 1–3), 10' (FIG. 4) are provided. In accordance with one especially preferred embodiment, a high purity aluminum alloy target 12 (FIGS. 1–3) is bonded to 6061 aluminum alloy backing plate 14 (FIGS. 1–3) by mechanical zip bonding. In accordance with another especially preferred embodiment, a high purity copper alloy target 12 (FIGS. 1–3) is bonded to a low purity copper alloy backing plate 14 (FIGS. 1–3) by mechanical zip bonding. In accordance with yet another especially preferred embodiment, a high purity aluminum alloy target 12 (FIGS. 1–3) is diffusion bonded to a copper backing plate 14 (FIGS. 1–3). In accordance with still another especially preferred embodiment, a high purity titanium or tantalum alloy target 12 (FIGS. 1–3) is diffusion bonded to an aluminum backing plate 14 (FIGS. 1–3). In accordance with yet another especially preferred embodiment, a high purity aluminum alloy target 12 (FIGS. 1–3) is solder bonded to a copper backing plate 14 (FIGS. 1–3). In each of these especially preferred embodiment, discrete aluminum oxide particles 20 (FIGS. 1–3) having maximum dimensions of about 100 μm–1,000 μm, more preferably about 150 μm–600 μm, are distributed between the target 12 (FIGS. 1–3) and the backing plate 14 (FIGS. 1–3).

Figure 5:
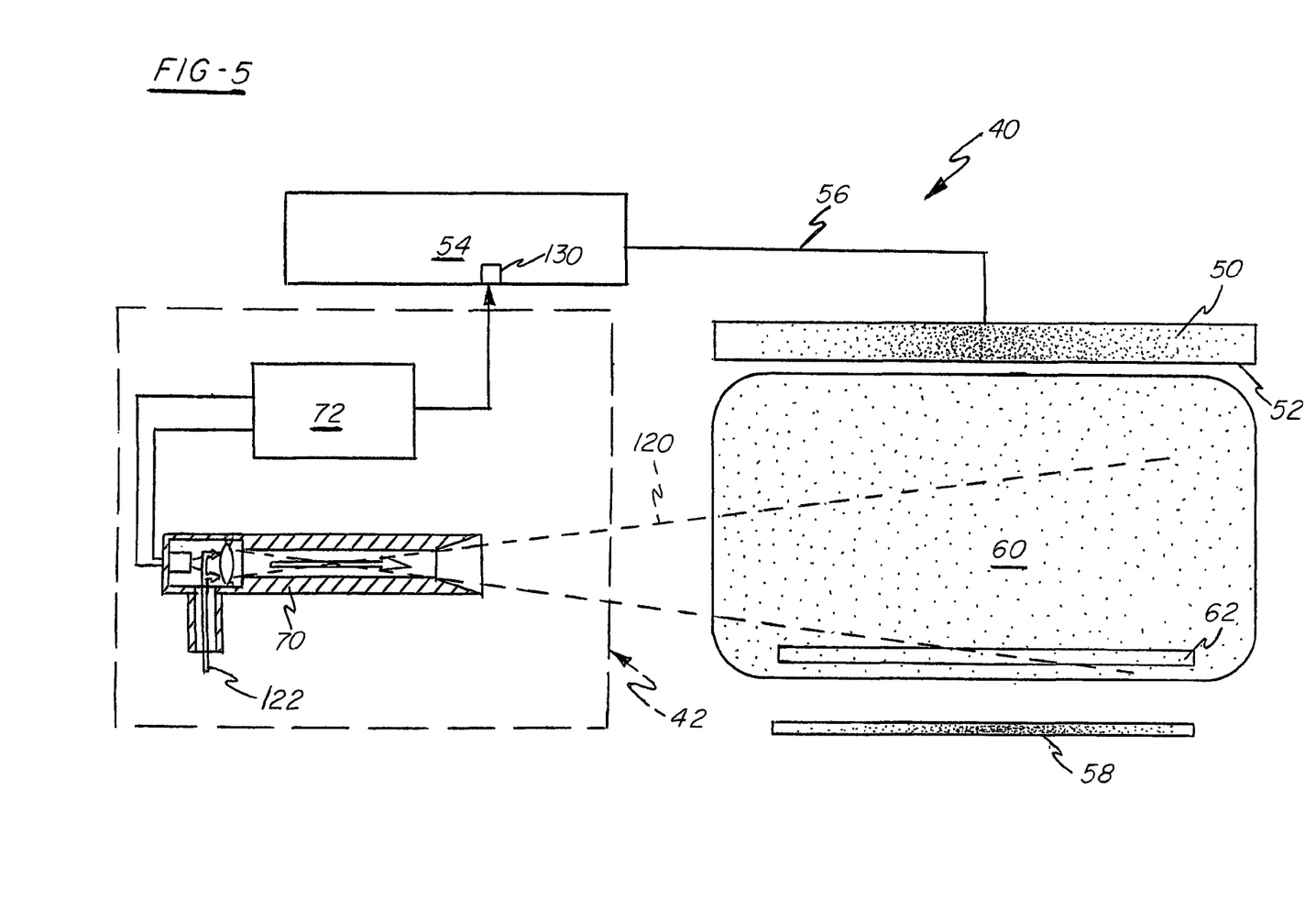
FIG. 5 is a schematic view of a first preferred embodiment of a sputtering system in accordance with the invention.

Referring to FIG. 5, a first preferred embodiment of a sputtering system 40 in accordance with the invention includes a target end-of-life sensor 42. The sputtering system 40 includes a sputter target assembly 50 defining a sputter surface 52; a power supply 54 for supplying electrical power to the sputter target assembly 50 through a power line 56; and an anode 58 for cooperation with the sputter target assembly 50 to form an electric field therebetween. The electric field generated between the sputter target assembly 50 and the anode 58 induces sputtering of material from sputter surface 52, thereby forming a plasma 60 between the sputter surface 52 and the anode 58. A substrate 62 is positioned in the plasma 60 to receive deposits of the material sputtered from the sputter surface 50. The plasma 60 is enclosed in a sputtering chamber (not shown) filled with inert gas (not shown) at low pressure, in accordance with conventional sputtering procedure. The design of sputtering systems is known to those of ordinary skill in the art and the particulars of the design are not critical to the present invention.

Figure 6:
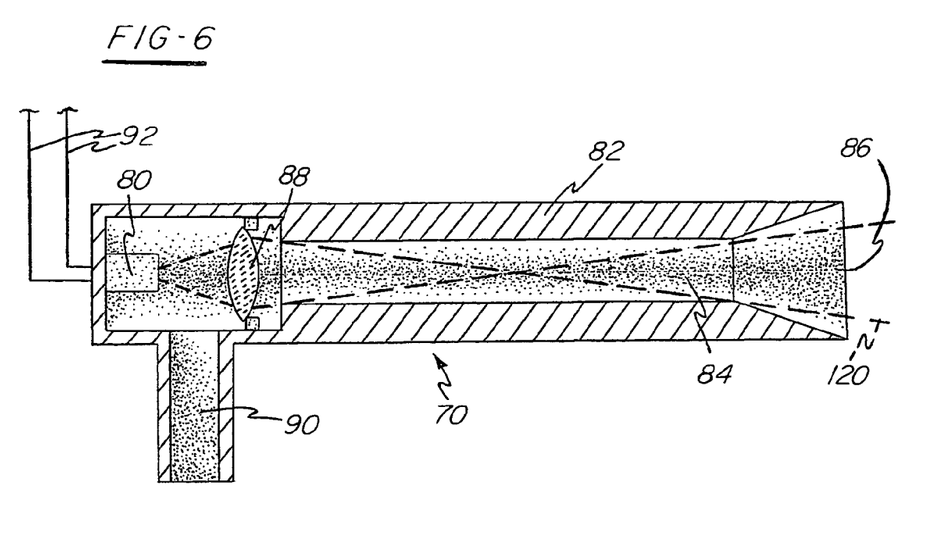
FIG. 6 is a schematic view of an optical detector for use in the sputtering system of FIG. 5.

The target end-of-life sensor 42 includes an optical detector 70 and a signal analyzer or processor 72. As shown in FIG. 6, the optical detector 70 includes a photon detector 80, such as a photo-resistive sensor or a charge couple device (CCD), positioned in a housing 82 defining a narrow channel 84 which terminates in an aperture 86. A lens 88 is positioned in the housing 82 between the photon detector 80 and the narrow channel 84. A gas feed line 90 communicates with the interior of the housing 82 near the photon detector 80 and the lens 88. Electrical leads 92 conduct electrical signals from the photon detector 92 to the processor 72 (FIG. 5).

A preferred method for sputtering in accordance with the invention comprises the steps of applying electrical power from the power supply 54 through the power line 56 to the sputter target assembly 50; causing the sputter target assembly 50 to produce an electromagnetic signal (not shown) when a target end-of-life condition exists; and monitoring the sputter target assembly 50 to detect the electromagnetic signal.

Figure 7:
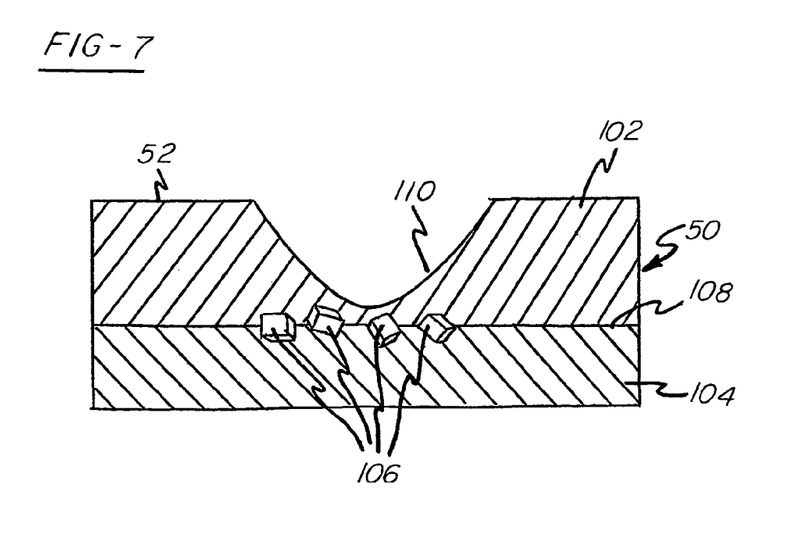
FIG. 7 is a schematic sectional view of target in accordance with the invention approaching a target end-of-life condition.

A preferred method for causing the sputter target assembly 50 to produce the electromagnetic signal (not shown) indicative of the target end-of-life condition comprises providing a sputter target assembly 50 as shown in FIG. 7, including a target 102 defining the sputter surface 52; a backing plate 104; and dielectric particles 106 between the target 102 and the backing plate 104 near an interface 108. As material is sputtered from the sputter surface 52, the sputter surface 52 erodes, particularly along sputter tracks 110. As the trough 112 of the erosion groove formed along the sputter track 110 approaches the interface 108, the dielectric particles 106 are exposed to the sputtering plasma.

The electromagnetic signal (not shown) indicative of the target end-of-life condition takes the form of electromagnetic phenomena accompanying the onset of a threshold degree of arcing (not shown) which occurs when the dielectric particles 106 are exposed to the sputtering plasma. Such electromagnetic phenomena include light emitted by the arcing (not shown) on the sputter surface 52, changes in the current flow through the power line 56 caused by such arcing and emission of electromagnetic signals (e.g., radio waves).

Returning to FIGS. 5 and 6, the target end-of-life monitoring system 42 (FIG. 5) monitors the sputter target assembly 50 (FIG. 5) to detect light emitted as arcing occurs at the sputter surface 52 (FIG. 5). More specifically, light 120 (FIGS. 5 and 6) from the direction of the sputter target assembly 50 (FIG. 5) enters the optical detector 70 (FIGS. 5 and 6) through the aperture 86 (FIG. 6) and passes through the narrow channel 84 (FIG. 6). The lens 88 (FIG. 6) focuses the light 120 (FIGS. 5 and 6) onto the photon detector 80. The photon detector 80 generates an electrical signal (not shown) corresponding to the intensity of a selected band of frequencies of the light 120 as a function of time. This electrical signal (not shown) is communicated through the electrical leads 92 to the processor 72.

Meanwhile, a flow 122 (FIG. 5) of inert gas having the same composition as that in the sputtering chamber but at slightly higher pressure passes through the gas feed 90 (FIG. 6) and the housing 82 (FIG. 6) of the optical detector 70 (FIGS. 5 and 6) out into the sputtering chamber (not shown). The higher pressure of the flow 122 (FIG. 5) relative to the pressure of the inert gas (not shown) in the sputtering chamber (not shown) causes a reduction in the mean free path of any sputtered atoms (not shown) that enter the optical detector 70 (FIG. 5). These stray atoms will be scattered to the walls of the narrow channel 84 (FIG. 6) by the flow 122 (FIG. 5). This scattering inhibits the sputtered atoms (not shown) from depositing on the lens 88 (FIG. 6) and thereby reducing the intensity of the light 120 (FIG. 5) which passes through the lens 88 onto the photon detector 80 (FIG. 6).

Turning exclusively to FIG. 5, the processor 72 processes the electrical signal (not shown) from the optical detector 70 to look for pre-determined patterns in the signal indicative of the threshold degree of arcing (not shown) on the sputter surface 52. In accordance with one processing method, the processor 72 takes a Fourier transform of the electrical signal (not shown) and analyzes the Fourier transform for evidence of periodic arcing. In accordance with another processing method, the signal is analyzed to detect a threshold number of multiple arc events within a preset time interval, for example, five arcing events within a one-second interval. Most preferably, the processor 72 is so programmed as to ignore occasional arc events and ambient light from the plasma 60. The programming of these tasks is within the ordinary skill in the art and will not be described further.

Most preferably, the processor 72 is in electrical communication with a conventional electrically-actuated switch 130 in the power supply 54 to shut down the power supply 54 when a target end-of-life condition is reached. When the processor 72 detects a threshold degree of arcing, it transmits a shut-down electrical signal (not shown) to the switch 130. The switch 130 responds to the shut-down electrical signal (not shown) by removing the electrical power (not shown) from the sputter target assembly 50, thereby effectively ending the sputtering process.

Figure 8:
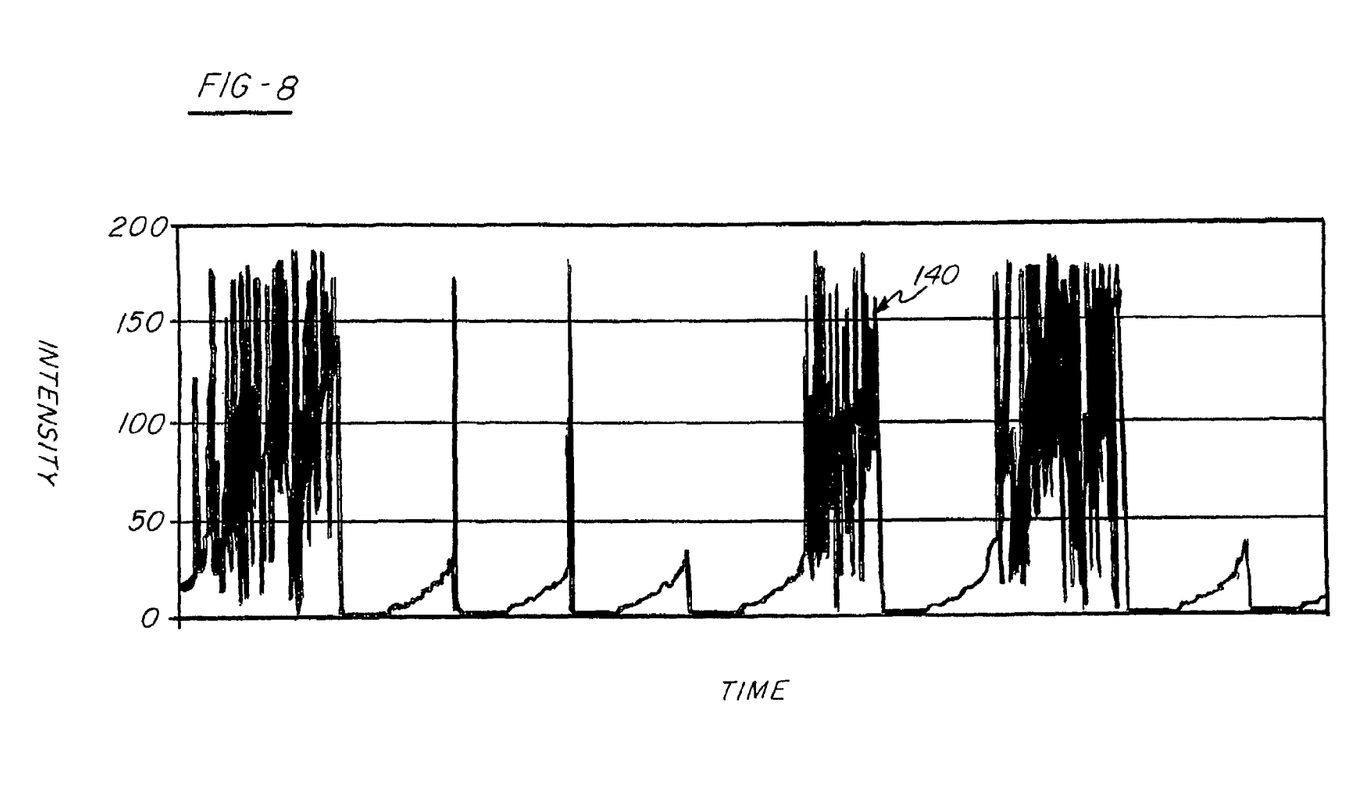
FIG. 8 is a chart illustrative of the relationship of optical intensity detected in a sputter chamber to time over the lifetime of a preferred target in accordance with the present invention.

FIG. 8 shows a trace 140 of an exemplary signal generated from light emissions measured during a sputtering process performed in a sputter system of the type shown at 40 in FIG. 5. Movement from left-to-right in FIG. 8 is indicative of increasing time, whereas movement from bottom-to-top in FIG. 8 is indicative of increasing light intensity. The periodic intensity spikes appearing toward the right side of the trace 140 are indicative of threshold degrees of arcing corresponding to a target end-of-life condition.

Figure 9:
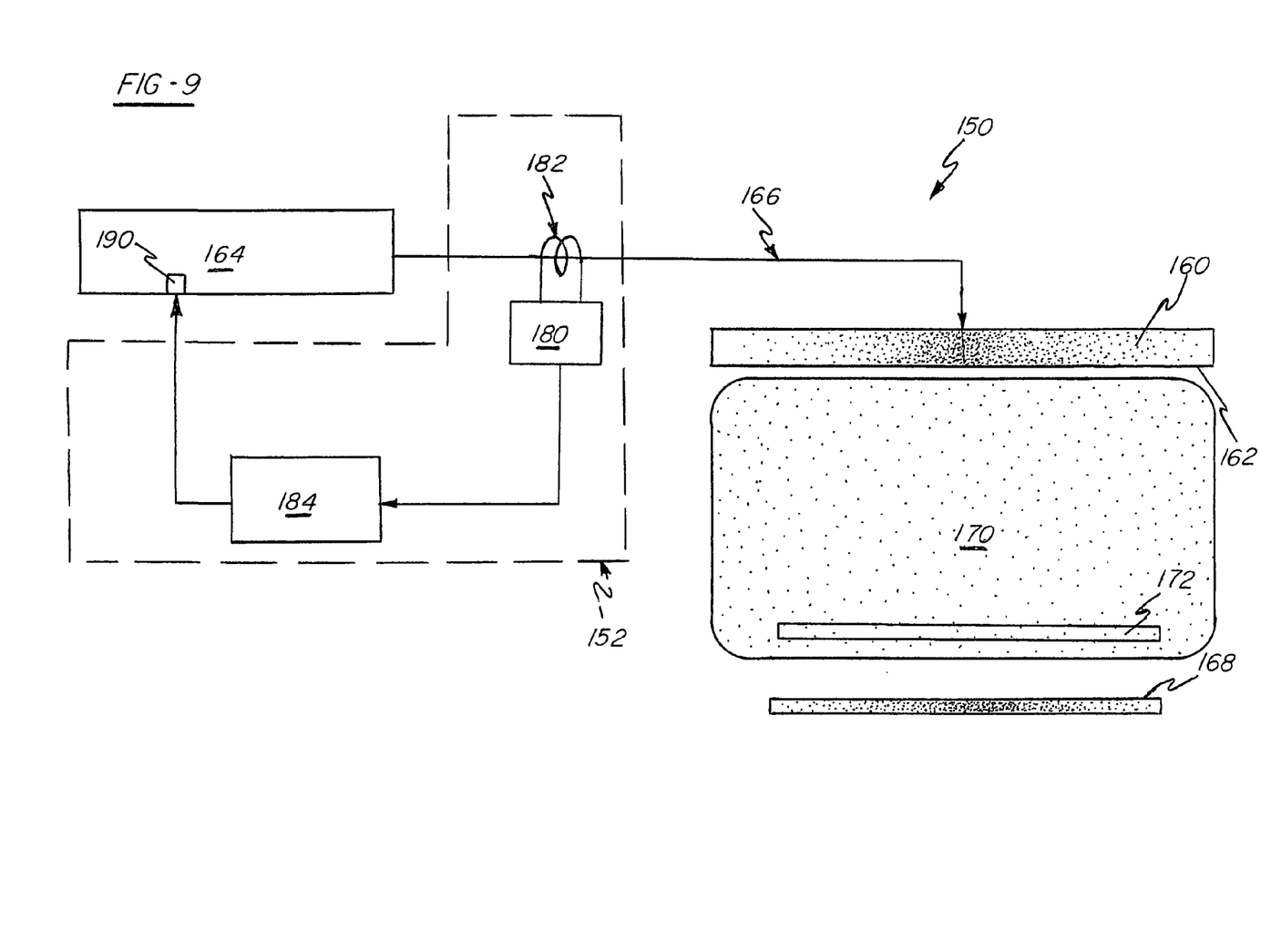
FIG. 9 is a schematic view of a second preferred embodiment of a sputtering system in accordance with the invention.

Referring to FIG. 9, a second preferred embodiment of a sputtering system 150 in accordance with the invention includes a target end-of-life sensor 152. The sputtering system 150 includes a sputter target assembly 160 defining a sputter surface 162; a power supply 164 for supplying electrical power to the sputter target assembly 160 through a power line 166; and an anode 168 for cooperation with the sputter target assembly 160 to form an electric field (not shown) therebetween. The electric field (not shown) generated between the sputter target assembly 160 and the anode 168 induces sputtering of material from sputter surface 162, thereby forming a plasma 170 between the sputter surface 162 and the anode 168. A substrate 172 is positioned in the plasma 170 to receive deposits of the material sputtered from the sputter surface 160. The plasma 170 is enclosed in a sputtering chamber (not shown) filled with inert gas (not shown) at low pressure, in accordance with conventional sputtering procedure. The design of sputtering systems is known to those of ordinary skill in the art and the particulars of the design are not critical to the present invention.

The target end-of-life sensor 152 includes a converter/filter circuit 180 in electrical communication with an induction coil 182 and with a processor 184. The induction coil encircles the power line 166 to monitor current flow through the power line 166.

A preferred method for sputtering in accordance with the invention comprises the steps of applying electrical power from the power supply 164 through the power line 166 to the sputter target assembly 160; causing the sputter target assembly 160 to produce an electromagnetic signal (not shown) when a target end-of-life condition exists; and monitoring the sputter target assembly 160 to detect the electromagnetic signal. A preferred method for causing the sputter target assembly 160 to produce the electromagnetic signal (not shown) when the target end-of-life condition exists includes providing a sputter target assembly 160 including a target, a backing plate and dielectric particles between the target and backing plate, as illustrated in FIGS. 2,4 and 7.

The target end-of-life sensor 152 monitors current flow through the power line 166 to detect changes in current flow indicative of arcing at the sputter surface 162. When arcing occurs, the voltage through the power line 166 drops and the current through the power line 166 spikes. Such current spikes induce analog voltage signals (not shown) in the induction coil 182. These voltage signals (not shown) are filtered and/or converted to digital form in the converter/ filter circuit 180 to produce a digital signal (not shown) indicative of arcing at the sputter surface 162.

The processor 184 processes the digital signal (not shown) from the converter/filter circuit 180 to look for pre-determined patterns in the signal indicative of the threshold degree of arcing on the sputter surface 162. Most preferably, this processing is performed by analyzing the signal to detect a threshold number of multiple arc events within a preset time interval. The programming of this analysis is within the ordinary skill in the art and will not be described further.

Most preferably, the processor 184 is in electrical communication with a switch 190 in the power supply 164 to shut down the power supply 164 when a target end-of-life condition is reached. When the processor 184 detects a threshold degree of arcing, it transmits a shut-down electrical signal (not shown) to the switch 190. The switch 190 responds to the shutdown electrical signal (not shown) by removing the electrical power (not shown) from the sputter target assembly 160, thereby effectively ending the sputtering process.

Figure 10:
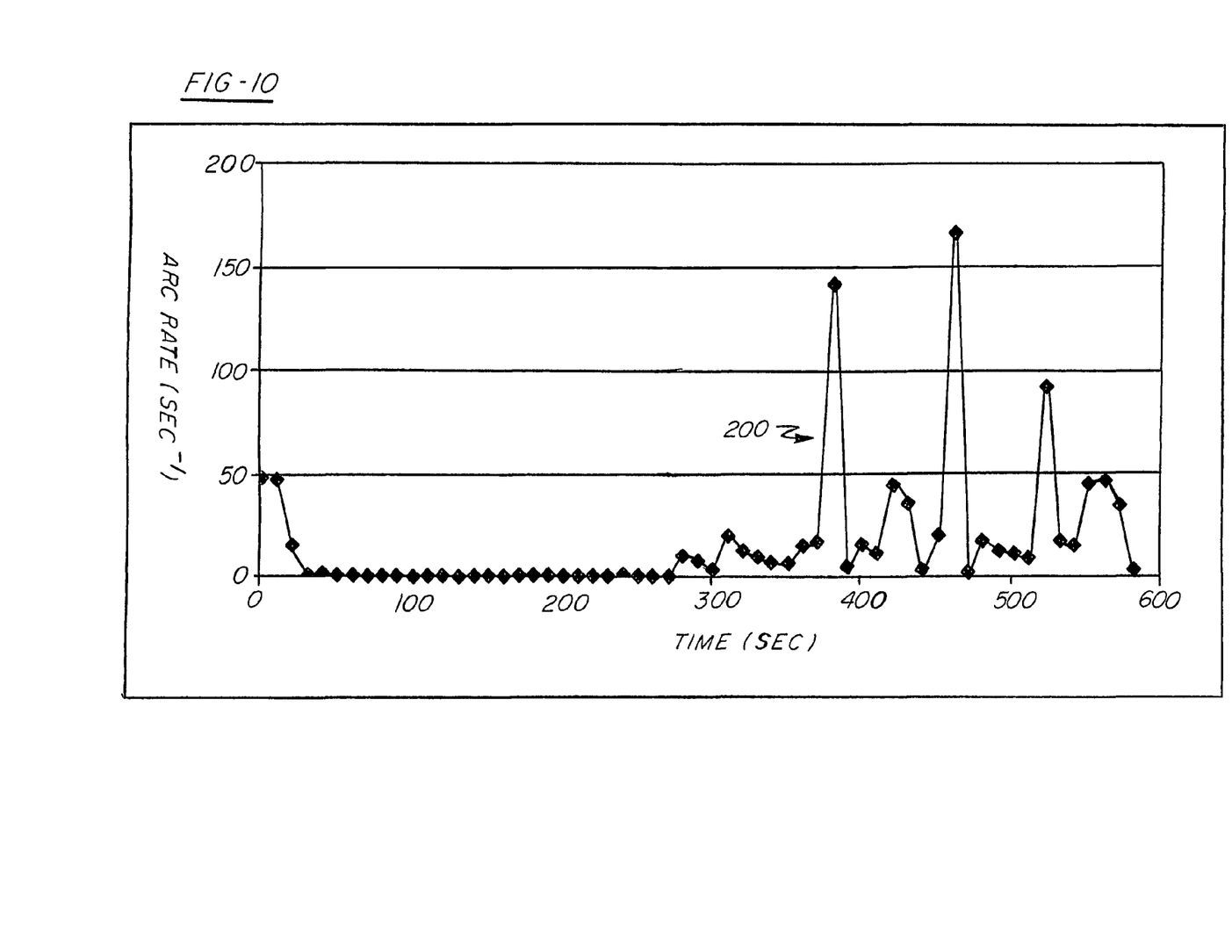
FIG. 10 is a chart illustrative of the relationship of arc rate over the lifetime of a preferred target in accordance with the present invention.

FIG. 10 shows a trace 200 of an exemplary signal generated from power line current spikes detected during a sputtering process performed in a sputter system of the type shown at 150 in FIG. 9. Movement from left-to-right in FIG. 8 is indicative of increasing time, whereas movement from bottom-to-top in FIG. 8 is indicative of increasing arc rate per time. The relatively high arc rate prior to approximately 30 seconds is due to sputtering of the surface oxide on a new target. The increased arc rate after approximately 300 seconds is indicative that a target end-of-life condition is being reached. In the sputtering system characterized by the trace 200 of FIG. 10, an arc rate greater than approximately 50 $\sec^{-1}$ would be a reasonable threshold to indicate that a target end-of-life condition had been reached and that the power supply 164 (FIG. 9) should be shut down.

The following example is intended to be illustrative of the invention only and is not intended to limit the scope of the invention as set forth in the accompanying claims.

EXAMPLE

A study was performed on 12.98 inch aluminum alloy targets to evaluate the usefulness of the preferred methods and apparati of the invention in indicating target end-of-life conditions. Eight radial stripes of boron nitride paint were applied on rear surfaces of two of the targets across the main sputter track of each. Eight radial stripes of a ceramic paste containing aluminum oxide were applied on a rear surface of a third target across the main sputter track. In the latter case, the rear surface of the third target was first roughened using a handheld engraver with a sharp carbide tip. A ceramic paste comprising aluminum oxide in a silicone-based liquid sold under the trademark CERAMABOND 552 by Aremco Products, Inc. of Valley Cottage, N.Y. was then painted onto the roughened portions of the rear surface of the third target. The paste was allowed to air dry for 15 minutes and then the target was bonded to a backing plate by vacuum electron beam welding. The two targets painted with the boron nitride paint were sputtered to full life. The target painted with the aluminum oxide was sputtered to full life plus three additional hours after initial burn through. The arc rate per ten second interval was measured as a function of sputtering time and target lifetime was determined by the onset of abnormal arcing conditions.

In each case, a sharp increase in arc rate was measured as a target end-of-life condition was reached. The target painted with the paste containing aluminum oxide exhibited both higher arc rates and a greater persistence of abnormal arcing than did the target painted with the boron nitride paint. Visual inspection of the targets verified penetration of the target material at the target end-of life condition indication.

As a result of the electromagnetic signal generation in the form of arcing, radio waves may be generated in correlation to the increased arcing signaling the target's end of life condition. There radio waves can be audibly detected with a suitable RF receiver and then used to actuate a machine shut off response.

Also, the formation of increased arcing in response to the end-of-life condition will result in increased particle emission by the target and concomitant increased formation of particles or splats on the substrate. One can monitor this particle emission such as by monitoring the substrate wafers and then shut down the system when a predetermined normal level of such emissions is exceeded.

At present, it is preferred to paint or coat dots of the dielectric containing ink on the backing plate surface contiguous to the underside of the target. The periphery of the assembly is e-beam welded followed then by pressure consolidation. The preferred paint containing agglomerated dielectric particles is the aforementioned CERABOND material.

It is also to be noted that the dielectric material located proximate the target backing plate interface may be provided by conventional anodization techniques or in some instances, such as for Al surfaces, the requisite surface may simply be heated in an oxygen containing atmosphere.

While the methods and apparati described herein constitute preferred embodiments of the invention, it is to be understood that the invention is not limited to these preferred methods and apparati, and that changes may be made in either without departing from the scope of the invention, which is defined in the appended claims.

The invention claimed is:

1. A sputtering method comprising:
   (a) providing a target and backing plate and positioning said target and backing plate in an assembly with an interfacial surface formed therebetween;
   (b) providing dielectric particles having a maximum diameter within the range of about 100–1000 μm and positioning said particles proximate said interfacial surface;
   (c) applying an electrical power to said assembly whereby arcing occurs as said target erodes to expose said dielectric particles indicative of a target end of life condition.

2. A method as recited in claim 1 wherein said step (b) comprises providing dielectric particles having a maximum diameter of about 300–1,000 μm.

3. A method as recited in claim 1 wherein said dielectric particles are provided from the group consisting of aluminum oxide, boron nitride, silicon oxide, tantalum oxide, titanium oxide, silicon nitride, silicon carbide, magnesium oxide, and zirconium oxide.

4. A method as recited in claim 3 wherein said dielectric particles comprise aluminum oxide.

5. A method as recited in claim 4 comprising positioning said aluminum oxide particles along a sputter track of said target.

6. A method as provided in claim 1 further comprising (d) providing a sensor in operative association with said assembly for sensing said arcing.

7. A method as provided in claim 6 wherein said sensor comprises an optical sensor, said method further comprising providing a processor in electrical communication with said optical sensor.

8. A sputtering system comprising:
(a) a target and a backing plate positioned in an assembly with an interfacial surface formed therebetween;
(b) dielectric particles having maximum diameters within the range of about 100–1000 μm disposed proximate said interfacial surface,
(c) means for applying an electrical power to said assembly whereby arcing occurs as said target erodes to expose said dielectric particles indicative of a target end of life condition.

9. A sputtering system as recited in claim 8 wherein said dielectric particles have a maximum diameter of about 300–1,000 μm.

10. A sputtering system as recited in claim 8 wherein said dielectric particles are provided from the group consisting of aluminum oxide, boron nitride, silicon oxide, tantalum oxide, silicon nitride, silicon carbide, magnesium oxide, and zirconium oxide.

11. A sputtering system as recited in claim 10 wherein said dielectric particles are aluminum oxide particles.

12. A sputtering system as recited in claim 11 further comprising a sputtering track of said target and wherein said aluminum oxide particles are disposed along said sputtering track.

13. A sputtering system as recited in claim 8 further comprising a sensor in operative association with said assembly to sense said arcing.

14. A sputtering system as recited in claim 13 wherein said sensor is an optical sensor, said system further comprising a processor in electrical communication with said optical sensor.

* * * * *